(12) United States Patent
Sugar et al.

(10) Patent No.: US 6,871,049 B2
(45) Date of Patent: Mar. 22, 2005

(54) IMPROVING THE EFFICIENCY OF POWER AMPLIFIERS IN DEVICES USING TRANSMIT BEAMFORMING

(75) Inventors: Gary L. Sugar, Rockville, MD (US); Chandra Vaidyanathan, Bethesda, MD (US); Sifen Luo, Rockville, MD (US)

(73) Assignee: Cognio, Inc., Gaithersburg, MD (US)

( * ) Notice: Subject to any disclaimer, the term of this patent is extended or adjusted under 35 U.S.C. 154(b) by 44 days.

(21) Appl. No.: 10/249,063

(22) Filed: Mar. 13, 2003

(65) Prior Publication Data

US 2003/0181173 A1 Sep. 25, 2003

Related U.S. Application Data

(60) Provisional application No. 60/365,811, filed on Mar. 21, 2002, provisional application No. 60/365,775, filed on Mar. 21, 2002, and provisional application No. 60/365,797, filed on Mar. 21, 2002.

(51) Int. Cl.[7] .............................. H04B 1/02; H04B 1/04; H04Q 11/12
(52) U.S. Cl. .................... 455/103; 455/105; 455/127.1; 455/127.2; 455/561
(58) Field of Search .................... 455/103, 105, 455/127.2, 522, 561, 251.1, 126, 127.1, 127.3, 127.4, 562.1; 342/372, 377, 368, 371; 343/7 MS

(56) References Cited

U.S. PATENT DOCUMENTS

| 4,121,221 | A | * | 10/1978 | Meadows .................... 342/374 |
| 6,037,898 | A | * | 3/2000 | Parish et al. ................. 342/174 |
| 6,091,934 | A | | 7/2000 | Berman et al. ............. 455/13.4 |
| 6,141,567 | A | * | 10/2000 | Youssefmir et al. ..... 455/562.1 |
| 6,185,440 | B1 | * | 2/2001 | Barratt et al. ............ 455/562.1 |
| 6,266,528 | B1 | * | 7/2001 | Farzaneh ..................... 455/423 |
| 6,522,898 | B1 | * | 2/2003 | Kohno et al. ............. 455/562.1 |
| 6,570,929 | B1 | | 5/2003 | Eriksson ..................... 375/260 |
| 6,646,600 | B2 | * | 11/2003 | Vail et al. ................... 342/372 |
| 6,684,064 | B2 | | 1/2004 | Kazakevich et al. ........ 455/126 |
| 2002/0127978 | A1 | | 9/2002 | Khatri ......................... 455/103 |
| 2002/0147032 | A1 | * | 10/2002 | Yoon et al. ................. 455/562 |
| 2003/0022693 | A1 | * | 1/2003 | Gerogiokas et al. ........ 455/562 |
| 2003/0048761 | A1 | * | 3/2003 | Jarett .......................... 370/312 |
| 2003/0114108 | A1 | | 6/2003 | Frecassetti et al. ........... 455/61 |

OTHER PUBLICATIONS

PCT Search Report from counterpart PCT application No. PCT/US03/07561 filed Mar. 13, 2003.

* cited by examiner

Primary Examiner—Vivian Chin
Assistant Examiner—Raymond B. Persino
(74) Attorney, Agent, or Firm—D. Andrew Floam, Esq.

(57) ABSTRACT

Systems and methods for optimizing the efficiency of each of a plurality of power amplifiers that amplify a corresponding one of a plurality of radio frequency signals for transmission by a corresponding one of a plurality of antennas. Using transmit beamforming, the power of each amplified signal output by the power amplifiers may not be the same for all the power amplifiers, and may vary with changes in the communication channel between the transmitting device and receiving device. Each of the plurality of power amplifiers is controlled to operate with one or more operating parameters that optimize the efficiency for an output power level of corresponding ones of the radio frequency signals. By adjusting one or more operating parameters of each power amplifier according to changing requirements (e.g., the destination device and channel conditions), the efficiency of each power amplifier can be optimized. Consequently, one or more of the power amplifiers are operated with one or more operating parameters that reflects the output power actually needed for the corresponding radio frequency signal to be transmitted.

22 Claims, 8 Drawing Sheets

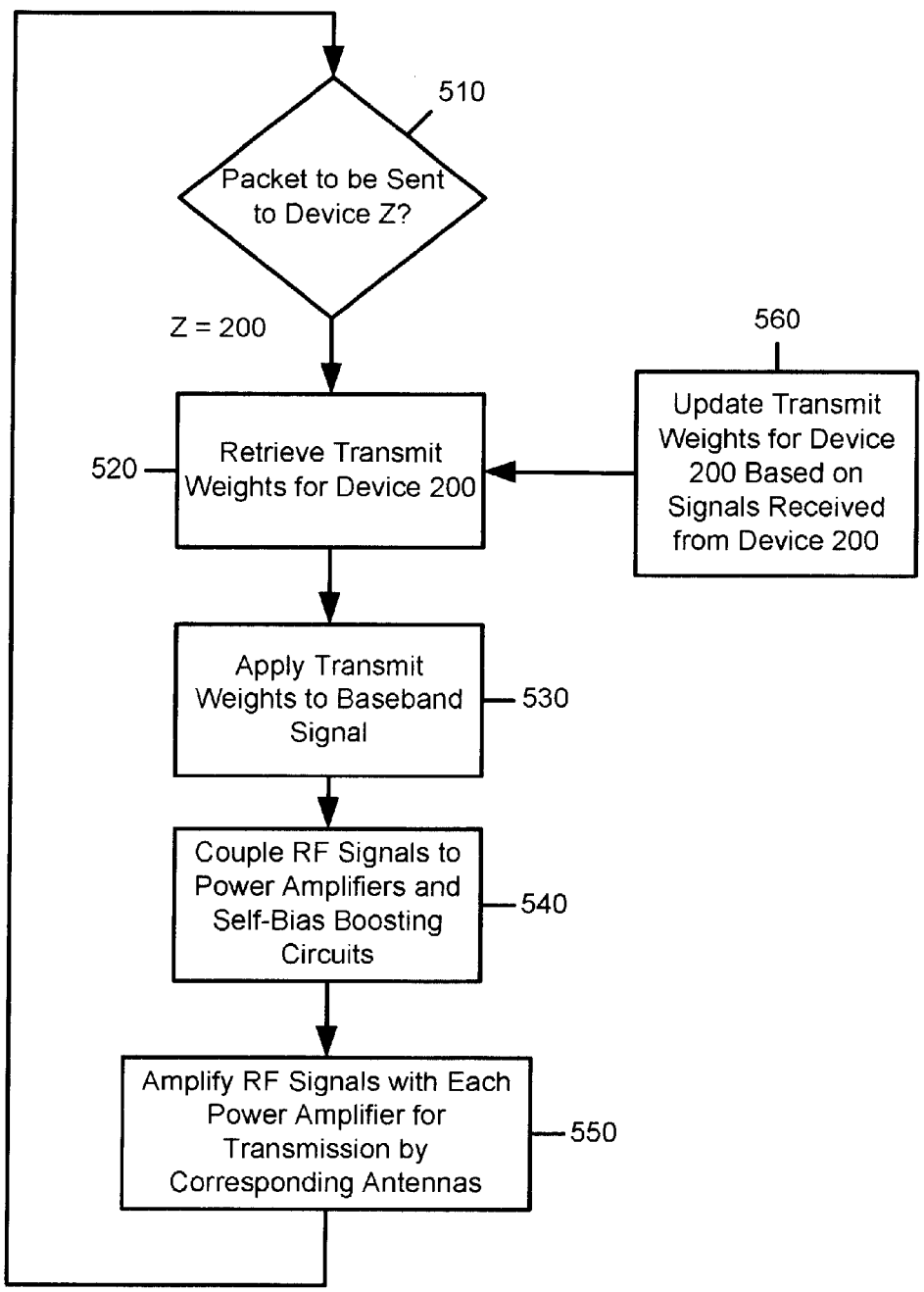

IMPROVING THE EFFICIENCY OF POWER AMPLIFIERS IN DEVICES USING TRANSMIT BEAMFORMING

CROSS REFERENCE TO RELATED APPLICATIONS

This application claims priority to U.S. Provisional Application No. 60/365,811, filed Mar. 21, 2002, to U.S. Provisional Application No. 60/365,775 filed Mar. 21, 2002 and to U.S. Provisional Application No. 60/365,797, filed Mar. 21, 2002. The entirety of each of these provisional applications is incorporated herein by reference.

BACKGROUND OF INVENTION

The present invention relates to radio communication devices.

In a radio transmitter, a power amplifier is included to amplify the radio frequency signal to be transmitted via an antenna. The power amplifier is controlled through a variety of mechanisms to output radio frequency energy at a desired power level. Generally, the maximum transmit power at the antenna is limited by regulatory requirements in the band of operation.

Typically, the power amplifier dominates the power consumption in the radio transmitter. Power amplifier efficiency is the ratio of the output power of the power amplifier to the power it consumes, $PA_{eff}=P_{out}/P_{cons}$.

The gain of the power amplifier is the ratio of the output power to the input power, $PA_{gain}=PA_{out}/PA_{in}$. The output power can be controlled by changing the input power level. For a desired maximum output power, the efficiency of the power amplifier can be controlled by adjusting the bias current of the power amplifier. The power consumption of the power amplifier is a function of the DC current which is determined by the power amplifier bias current and the output power:

$$P_{cons}=PA_{dc}+f(P_{out}).$$

High power amplifier efficiency introduces non-linearities that affect the integrity of the transmit signal. Therefore, the operating point of the power amplifier is selected by trading efficiency versus linearity.

Transmit beamforming has been proposed as a way to improve data rate and range of signals transmitted to another device. Multiple transmit antennas are used at the transmitter of one device when transmitting signals to another device, whereby weighted versions of the baseband signal are upconverted and transmitted by corresponding ones of a plurality of antennas. The transmit antenna weights are computed by maximizing a cost function (e.g., signal-to-noise ratio at the receiver of the other device). One example and application of transmit beamforming is disclosed in U.S. patent application Ser. No. 10/174,728, filed Jun. 19, 2002 and entitled "System and Method for Antenna Diversity Using Joint Maximal Ratio Combining," the entirety of which is incorporated herein by reference.

According to these techniques each transmitter requires a power amplifier to amplify the signal at the input to the antenna to a desired level. For N antennas, the total power consumption could reach N times the power consumption of a single antenna system. Any given power amplifier may be required to transmit at a level up to a maximum power level. What is needed is a procedure and system to optimize the DC power consumption of the power amplifiers when transmitting from multiple antennas.

SUMMARY OF INVENTION

Systems and methods are provided for optimizing the efficiency of each of a plurality of power amplifiers that amplify a corresponding one of a plurality of radio frequency signals for transmission by a corresponding one of a plurality of antennas. Using transmit beamforming, the power of each amplified signal output by the power amplifiers may not be the same for all the power amplifiers, and may vary with changes in the communication channel between the transmitting device and receiving device. Each of the plurality of power amplifiers is controlled to operate with one or more operating parameters that optimize the efficiency for an output power level of corresponding ones of the radio frequency signals. By adjusting one or more operating parameters of each power amplifier according to changing requirements (e.g., the-destination device and channel conditions), the efficiency of each power amplifier can be optimized. Consequently, one or more of the power amplifiers are operated with one or more operating parameters that reflects the output power actually needed for the corresponding radio frequency signal to be transmitted.

Other objects and advantages will become more apparent when reference is made to the following description taken in conjunction with the accompanying drawings.

BRIEF DESCRIPTION OF DRAWINGS

FIG. 8 is a flow chart depicting a method for controlling the power amplifiers in the system shown in FIG. 7.

DETAILED DESCRIPTION

Figure 1:
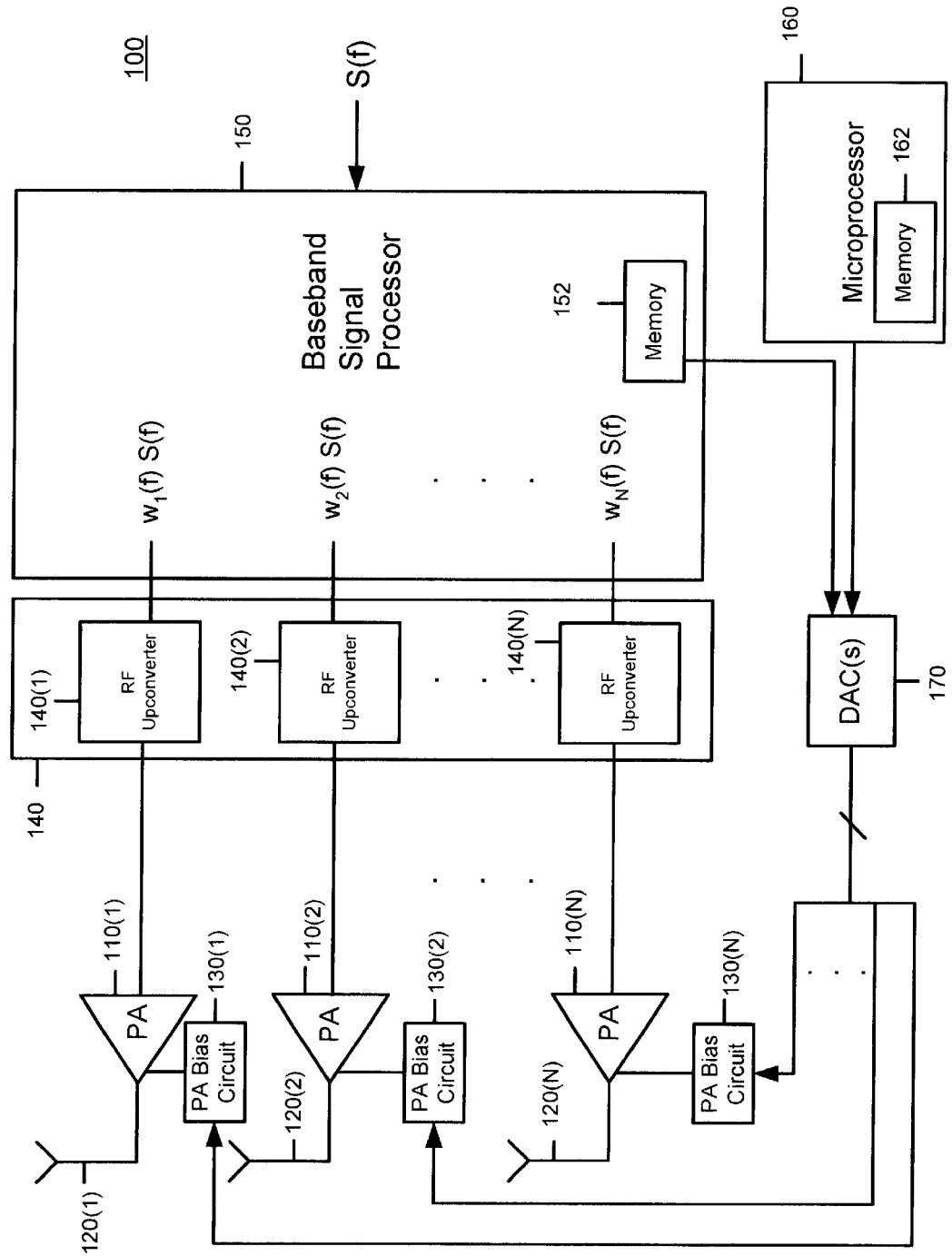
FIG. 1 is a block diagram of a system that optimizes the efficiency of a plurality of power amplifiers in a beamforming radio transmitter system according to a first embodiment.

Referring first to FIG. 1, a beamforming radio transmitter system is shown generally at reference numeral 100. The system 100 comprises a plurality of power amplifiers 110(1) through 110(N), each of which is coupled to a corresponding one of a plurality of transmit antennas 120(1) through 120(N). Each power amplifier 110(1) to 110(N) has a corresponding power amplifier bias circuit 130(1) to 130(N).

In a radio frequency (RF) transmitter section 140, there are a plurality of RF upconverters 140(1) through 140(N) each of which supplies a radio frequency signal to a corresponding one of the power amplifiers 110(1) to 110(N). The details of each RF upconverter 140(1) through 140(N) are not relevant to the beamforming transmitter system described herein. Further details of a suitable radio transmitter section are disclosed in, for example, commonly assigned and co-pending U.S. patent application Ser. No. 10/065,388 filed Oct. 11, 2002, and entitled "Multiple-Input Multiple-Output Radio Transceiver," the entirety of which is incorporated herein by reference. For example, there may be filters, oscillators, etc., between the RF section 140 and the power amplifiers 110(1) to 110(N), as well as filters between the power amplifiers 110(1) to 110(N) and transmit antennas 120(1) to 120(N).

The inputs to the RF section 140 are baseband signals $w_1$ (f)S(f) through $w_N$ (f)S (f), which are individual baseband signals produced by weighting the baseband signal S(f) with each of the plurality of transmit weights $w_1$ (f)S(f) through $w_N$ (f)S(f). Transmit weight $w_1$ (f) corresponds to the signal to be transmitted by antenna 120 (1), transmit weight $w_2$ (f) corresponds to the signal to be transmitted by antenna 120(2), and so on. The signal S(f) may be one signal or packet to be weighted, upconverted and transmitted simultaneously by the plurality of antennas 120(1) through 120 (N), or may be a stream of multiple packets to weighted, upconverted and transmitted simultaneously by the plurality of antennas 120(1) through 120(N).

The weighting computations may be performed in a baseband signal processor 150. For example, the baseband signal processor 150 may perform the necessary baseband modulation and formatting depending on the particular communication protocol employed, such as, for example, IEEE 802.11x. The baseband signal processor 50 may be implemented by a plurality of gates that execute the necessary instructions in an application specific integrated circuit (ASIC), dedicated microprocessor programmed with suitable instructions encoded on a memory medium, etc. The weighted baseband signals $w_1$ (f)S(f) through $w_N$ (f)S(f) are supplied as input to a corresponding one of the RF upconverters 140(1) through 140 (N).

Figure 5:
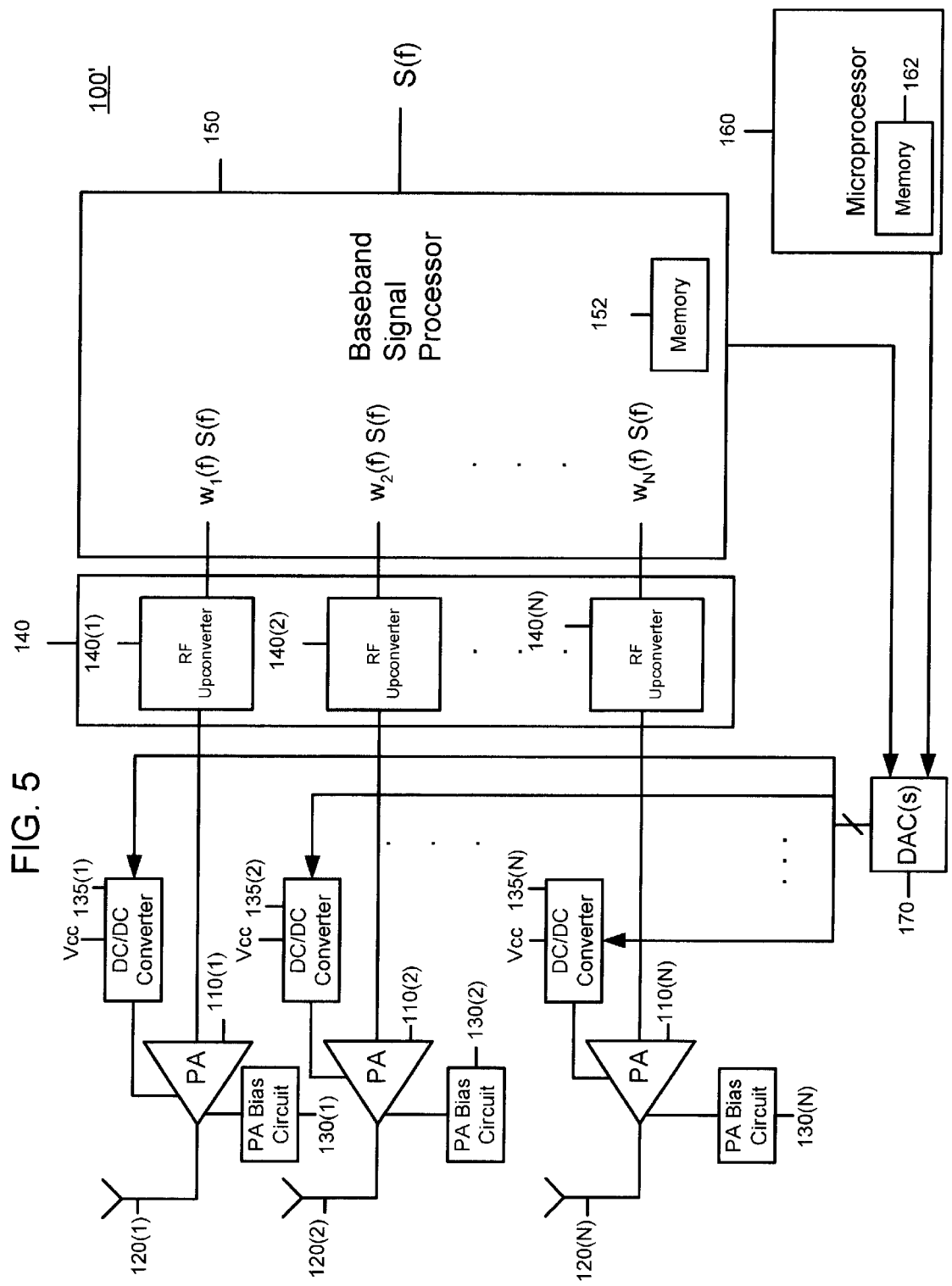
FIG. 5 is a block diagram of a system that optimizes the efficiency of a plurality of power amplifiers in a beamforming radio transmitter system according to a second embodiment.
Figure 7:
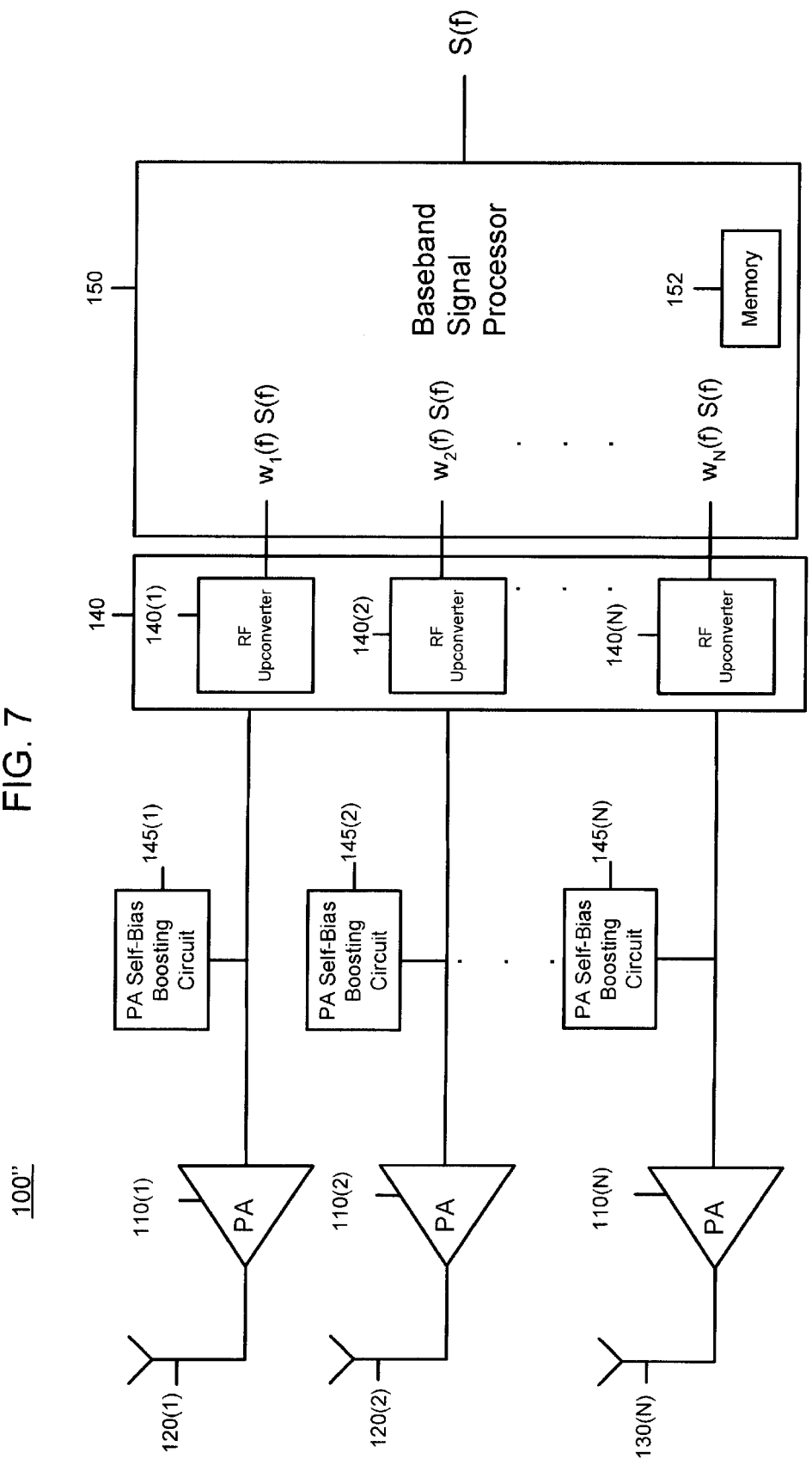
FIG. 7 is a block diagram of a system that optimizes the efficiency of a plurality of power amplifiers in a beamforming radio transmitter system according to a third embodiment.

When transmitting RF signals representing the weighted signals, the power consumption characteristics of the power amplifiers are controlled by adjusting one or more power amplifier operational parameters in order to optimize the efficiency of the power amplifiers. There are several ways in which the power amplifier efficiency can be optimized. FIG. 1 shows one mechanism in which the power amplifier bias circuits are controlled, FIG. 5 shows another mechanism in which the operating voltage to each power amplifier is adjusted and FIG. 7 illustrates still another mechanism in which the self-bias boosting circuits are used to automatically bias the power amplifiers. In each of these embodiments, one or more of the power amplifiers are operated with one or more operating parameters that reflects the output power actually needed for the corresponding transmit signal.

The maximum total radiated power from all the transmit antennas 120(1) through 120(N), $PA_{out\_total}$, must not exceed the limits of the regulatory requirements:

$$PA_{out\_total}=PA_{out(1)}+PA_{out(2)}+ \ldots +PA_{out(N)}<\text{Max. power.}$$

The regulatory requirements on the maximum transmit power is independent of the number of transmit antennas.

Figure 2:
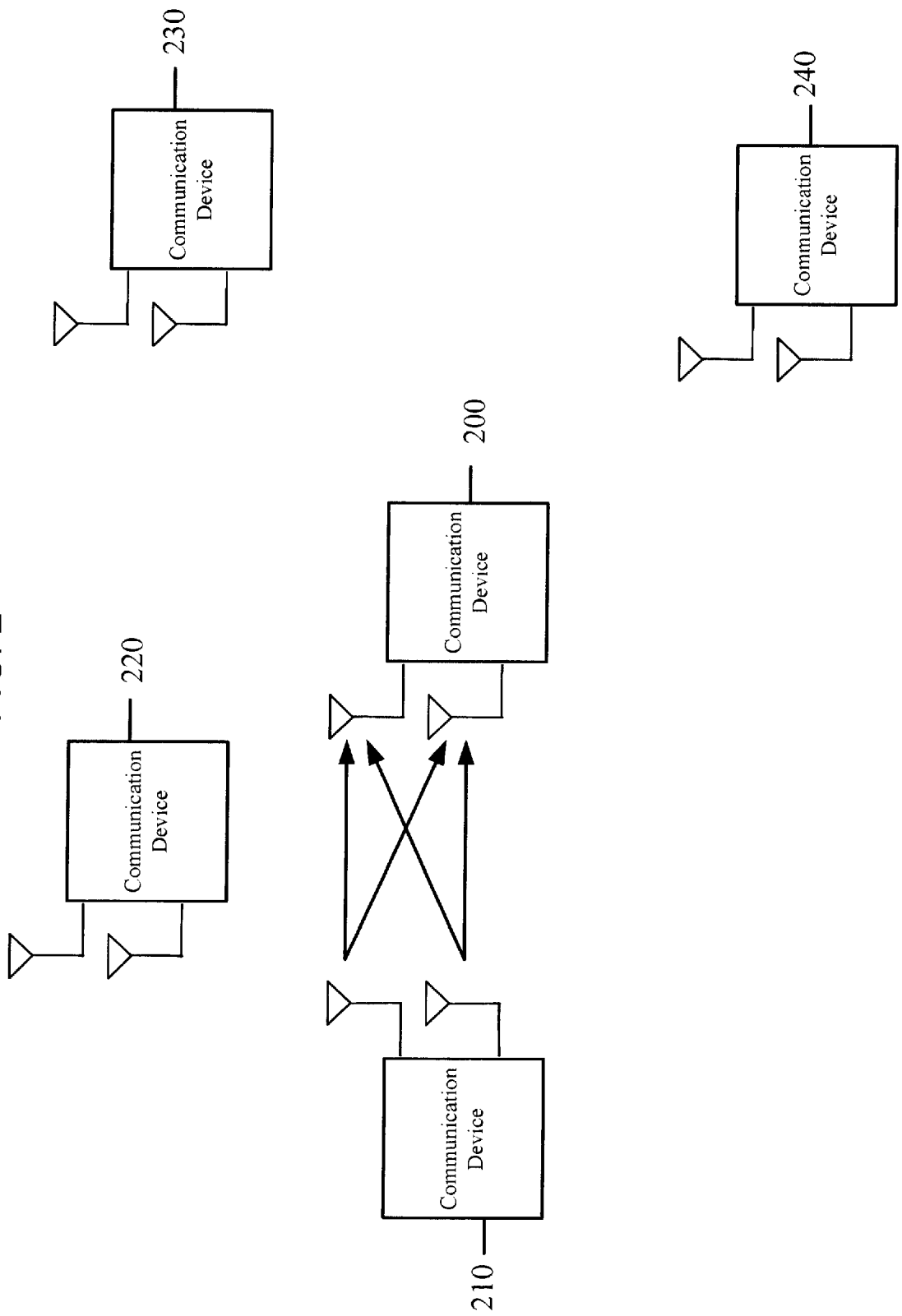
FIG. 2 is a block diagram showing multiple communication devices that may communicate between each other using transmit beamforming techniques.

With reference to FIG. 2, a plurality of radio communication devices 200, 210, 220, 230 and 240 having transmit beamforming capabilities is shown. The channel transfer function between any two communication devices is different. The optimum transmit weights depend on the channel transfer function between any two devices. The transmit weights of the transmitting device are different for each intended receiving device. Each communication device shown in FIG. 2 has two antennas for transmission and receptions, as an example.

It is statistically possible that for a particular channel, the optimum transmit antenna weights may dictate that all of the transmit power be generated through one antenna, and for a different channel, that all of the transmit power be generated through a different antenna. The power amplifiers would have to be biased such that they are all capable of transmitting all of the power. Therefore, the DC power consumption of each power amplifier is the same as the DC power of a single power amplifier when a single antenna is used:

$$PA_{dc\_total}=PA_{dc(1)}+PA_{dc(2)}+ \ldots +PA_{dc(N)}=N\ PA_{dc(1)}.$$

Although the total output power is the same, the DC power consumption of N power amplifiers is N times the DC power of a single power amplifier in the single antenna case. This would result in substantial power consumption and is inefficient because for one or more of the transmit signals, the corresponding power amplifier need not be operated with parameters sufficient for maximum power amplification.

Figure 3:
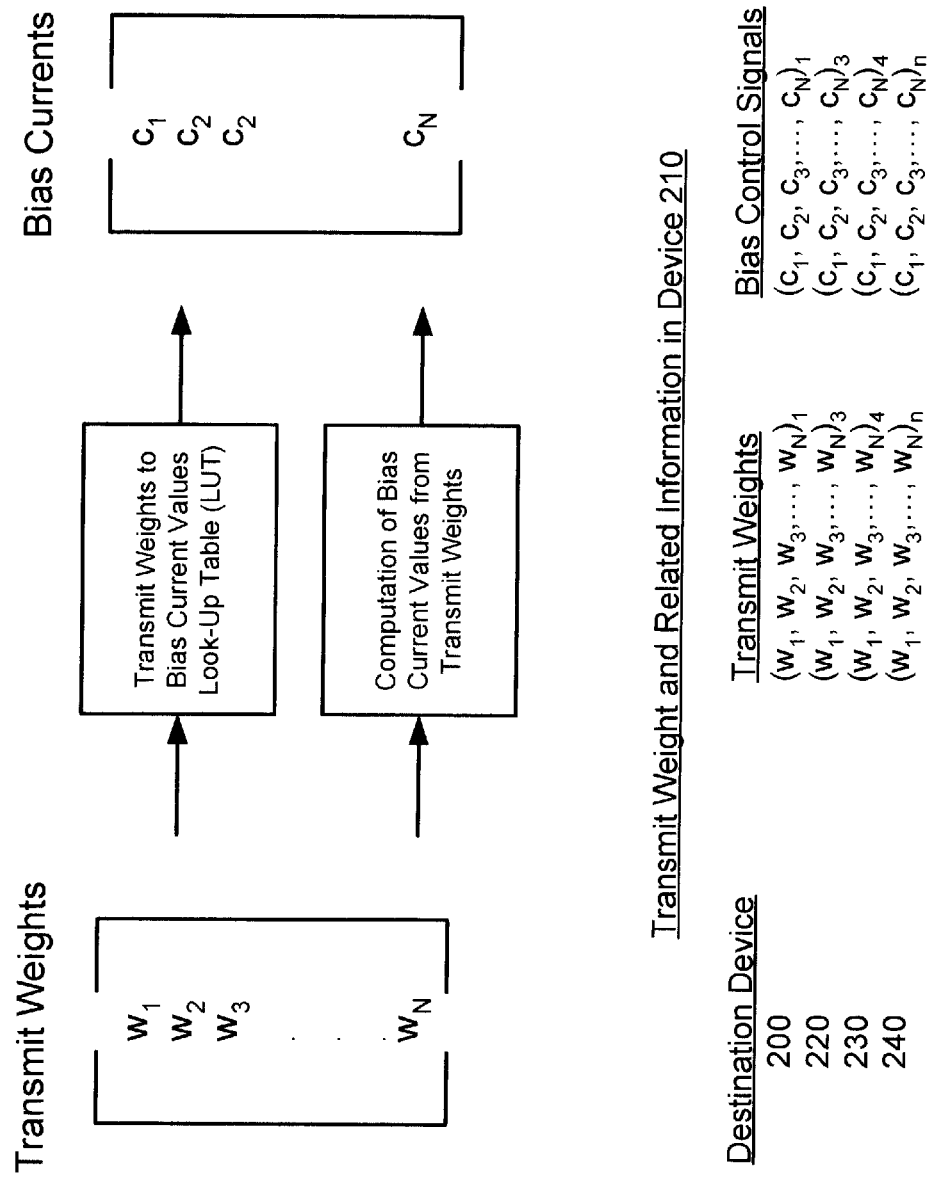
FIG. 3 is a diagram that illustrates the data that may be used to generate parameters that optimize the efficiency of the power amplifiers.

With reference to FIG. 3 in conjunction with FIG. 1, a procedure is described to dynamically adjust the bias supplied to the power amplifiers so as to optimize their DC power consumption. In any given communication device, the transmit antenna weights for each destination device are computed a priori and stored in a table at the transmitting station. For example, the transmit antenna weights may be stored indexed against an identifier of the destination device, such as the medium access control (MAC) address of the destination device. Techniques that a device may use to compute the transmit antenna weights may vary, and one such technique is described in the aforementioned co-pending U.S. non-provisional patent application referred to above.

In each communication device, transmit weights are used to weight a baseband signal to produce weighted signals representing a packet of information to be transmitted to a destination device. The bias circuits 130(1) through 130(N) for power amplifiers 110(1) through 110(N) control the bias voltage or current for each power amplifier. Information necessary to control the bias circuits is derived from the transmit weights. The bias circuits 130(1) through 130(N) for power amplifiers 110(1) through 110(N) can be adjusted on a per-packet basis to account to changes in the transmit weights that are the result of changing channel conditions between the transmitting device and a particular destination device. By adjusting the bias for each power amplifier, the gain and linearity for each power amplifier, as well as the DC current drain, is adjusted, to optimize the efficiency of the power amplifier at a required level of output power.

A microprocessor 160 may be used to control the bias voltages or currents of the bias circuits 130(1) through 130(N) by deriving digital current (or voltage values) that are converted to analog signals for each bias circuit by one or more digital-to-analog converters (DAC(s)) 170. The intelligence to derive the bias circuit control signals may alternatively be included in the baseband signal processor. Updated values for the transmit weights are stored in a memory 162 associated with the microprocessor and/or in a memory 152 associated with the baseband signal processor 150.

It may be desirable for all the power amplifiers to have the same efficiency. When a transmit packet is being prepared for transmission, the transmit antenna weights are used to compute the maximum transmit power at each antenna:

$$P_n = \int |w_n(f)|^2 df$$

The maximum transmit power at each antenna is used to compute the power amplifier bias (voltage or current) for the specified output power to optimize efficiency. As shown in FIG. 3, the bias control signals (e.g., bias control current values or bias control voltage values) are computed from the transmit weights using a mathematic formula computation, or a look-up-table (LUT) that stores control values corresponding to antenna weights. The power amplifier biases may be adjusted with the computed values before the start of the packet transmission for every transmitted packet so that there is no need to store state for the bias control signals. This process is repeated for every new packet. Alternatively, the biases can be left unchanged from transmit packet to transmit packet until there is a change in the transmit weights.

Figure 4:
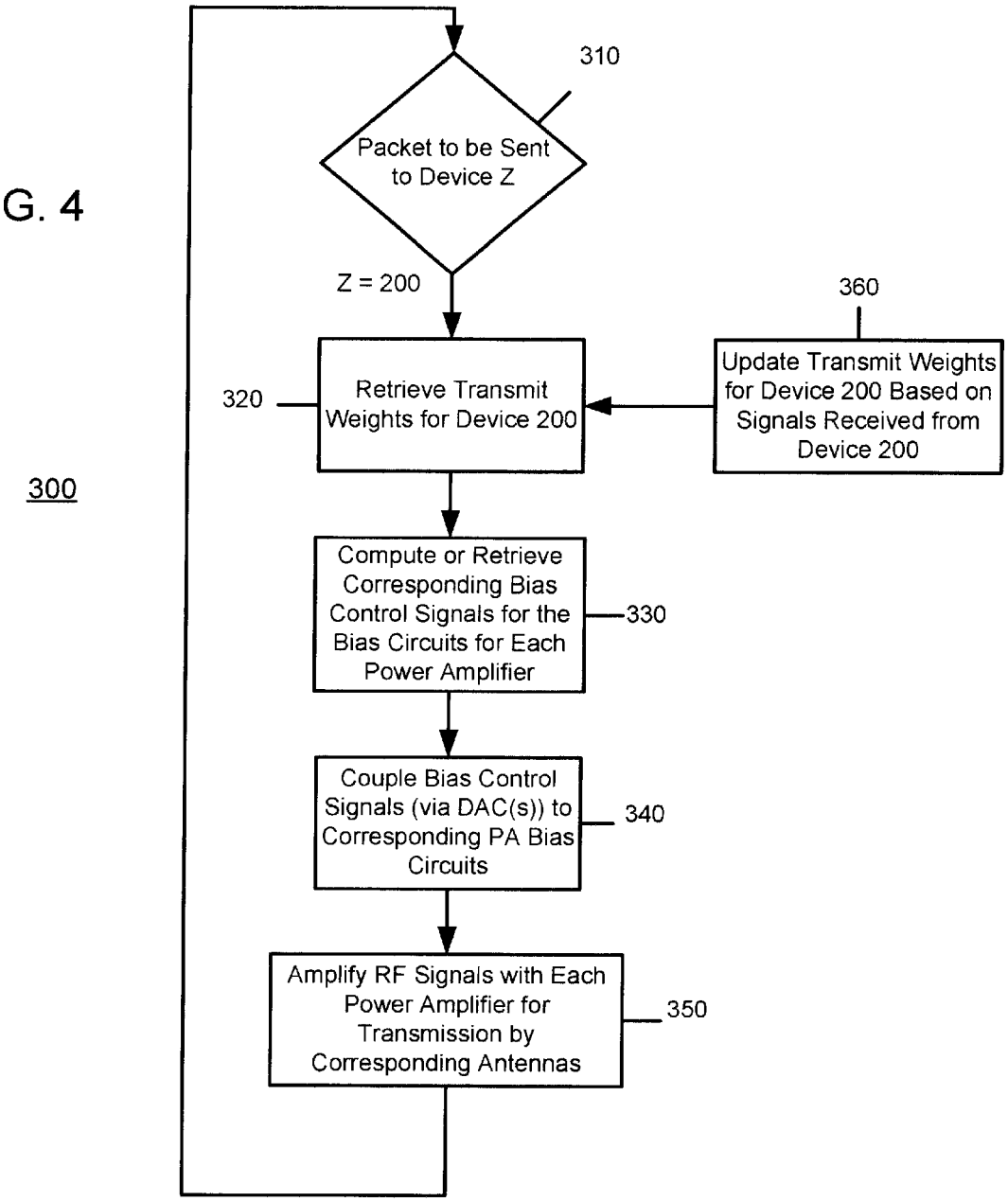
FIG. 4 is a flow chart depicting a method for controlling the power amplifiers in the system shown in FIG. 1.

To explain this in connection with a specific example, reference is made to a process 300 represented by the flow chart shown in FIG. 4, in which device 210 is preparing to transmit a packet to device 200. In step 310, a processor (baseband signal processor 150 or microprocessor 160) in device 210 determines that a packet is to be transmitted to device 200. The transmit weights for device 200 (stored in device 210) are retrieved in step 320, and in step 330, the bias control signals are computed for the bias circuits for each power amplifier. In step 340, the bias control signals are converted to analog signals and coupled to the bias circuits. In step 350, the RF signals coupled to each amplifier are amplified by the corresponding power amplifier for transmission by the corresponding antenna. This procedure optimizes the DC power consumption of each power amplifier and will approach the total power amplifier DC power consumption of the single antenna/single power amplifier case. The transmit weights may be updated (based on each packet received from device 200) in step 360.

Turning to FIG. 5, a beamforming radio transmitter system 100' having many elements in common with the beamforming radio transmitter system 100 shown in FIG. 1, with the exception of a plurality of DC/DC converter circuits 135(1) to 135(N) for each power amplifier 110(1) to 110(N). Rather than control the power amplifier bias circuits 130(1) to 130(N), operation of the power amplifiers 110(1) to 110(N) is controlled by adjusting the operating voltage used by each power amplifier through the DC/DC converter circuits 135(1) to 135(N). Normally, the operating voltage used by a power amplifier, referred to as Vcc, is fixed. However, if a signal is to be amplified by the power amplifier at a relatively low level compared to Vcc, then the power amplifier will not be operated efficiently at an operating voltage equal to Vcc when amplifying a signal at that lower level. Accordingly, the operating voltage to each power amplifier is adjusted according to the output power level required by that amplifier. Each DC/DC converter 135(1) to 135(N) is coupled to Vcc, and is controlled by a control signal to convert the voltage Vcc to an operating voltage at a level anywhere from a minimum voltage level up to Vcc, according to the transmit weight for the corresponding power amplifier.

The operating voltage control signals for each DC/DC converter 135(1) to 135(N) may be generated from the transmit weights in a manner similar to that shown in FIG. 3, either by way of a mathematical computation or a look-up-table. Digital DC/DC converter control signals computed by either the microprocessor 160 or baseband signal processor 150 are converted to analog operating voltage control signals by one or more DAC(s) 170 and coupled to the corresponding DC/DC converter 135(1) to 135 (N).

A procedure 400 for optimizing the power amplifiers in the embodiment of FIG. 5 is shown in FIG. 6, again in connection with the example where device 210 is preparing to transmit a packet to device 200. In step 410, a processor (baseband signal processor 150 or microprocessor 160) in device 210 determines that a packet is to be transmitted to device 200. The transmit weights for device 200 (stored in device 210) are retrieved in step 420, and in step 430, the operating voltage control signals are computed for the DC/DC converter for each power amplifier. In step 440, the operating voltage control signals are converted to analog signals and coupled to the DC/DC converters. In step 450, the RF signals coupled to each amplifier are amplified by the corresponding power amplifier for transmission by the corresponding antenna. The transmit weights may be updated (based on each packet received from device 200) in step 460.

It may be desirable to control both the bias and operating voltage of each power amplifier, thereby combining the techniques shown in FIGS. 1 and 5.

Turning to FIG. 7, a beamforming radio transmitter system 100" is shown according to a third embodiment. The system 100" is similar to radio transmitter system 100 except that it includes power amplifier self-bias boosting circuits 145(1) to 145(N) instead of the bias circuits 130(1) to 130(N). As is known in the art, self-bias boosting circuits automatically bias a power amplifier by an amount according to the level of the input signal supplied to the power amplifier, thereby providing the necessary bias to the power amplifier to amplify that input signal with optimized efficiency. Self-bias boosting circuits are known in the art and are not described in detail herein. The plurality of RF signals output by the RF upconverters 140(1) to 140 (N) are weighted according to the transmit weights $w_1$ (f)S(f) through $w_N$(f)S(f), and therefore will be at respective power levels according to these weights. The self-bias boosting circuits 145(1) to 145(N) will detect the power levels of these signals and automatically provide the appropriate bias to the associated power amplifiers 110(1) to 110(N) to optimize the efficiency of those power amplifiers when amplifying the corresponding RF signal.

A procedure 500 for optimizing the power amplifiers in the embodiment of FIG. 7 is shown in FIG. 8, in connection with the example where device 210 is preparing to transmit a packet to device 200. In step 510, a processor (baseband signal processor 150 or microprocessor 160) in device 210 determines that a packet is to be transmitted to device 200. The transmit weights for device 200 (stored in device 210) are retrieved in step 520, and in step 530 transmit weights are applied to the baseband signal to be transmitted to generate a plurality of weighted baseband signals. In step 540, the corresponding upconverted RF signals are coupled to the power amplifiers 110(1) to 110(N) and their corresponding self-bias boosting circuits 145(1) to 145(N). The self-bias boosting circuits 145(1) to 145(N) sense the power level of the RF signals and adjust the bias to the corresponding power amplifiers accordingly to optimize their operation when amplifying the corresponding RF signal. In step 550, the RF signals are amplified and coupled to the corresponding antenna for transmission. The transmit weights may be updated (based on each packet received from device 200) in step 560.

It may be desirable to control the operating voltage of each power amplifier in conjunction with the self-bias boosting circuits, thereby combining the techniques shown in FIGS. 5 and 7.

Furthermore, it may be desirable to adjust one or more operating parameters of one, some, but not all of the power amplifiers according to changing requirements. For example, in order to save implementation complexity, certain ones of the power amplifiers can be operated with operational parameters at nominal conditions suitable for any degree of power amplification, while other ones of the power amplifiers can be adjusted dynamically using any of the techniques described herein.

Figure 6:
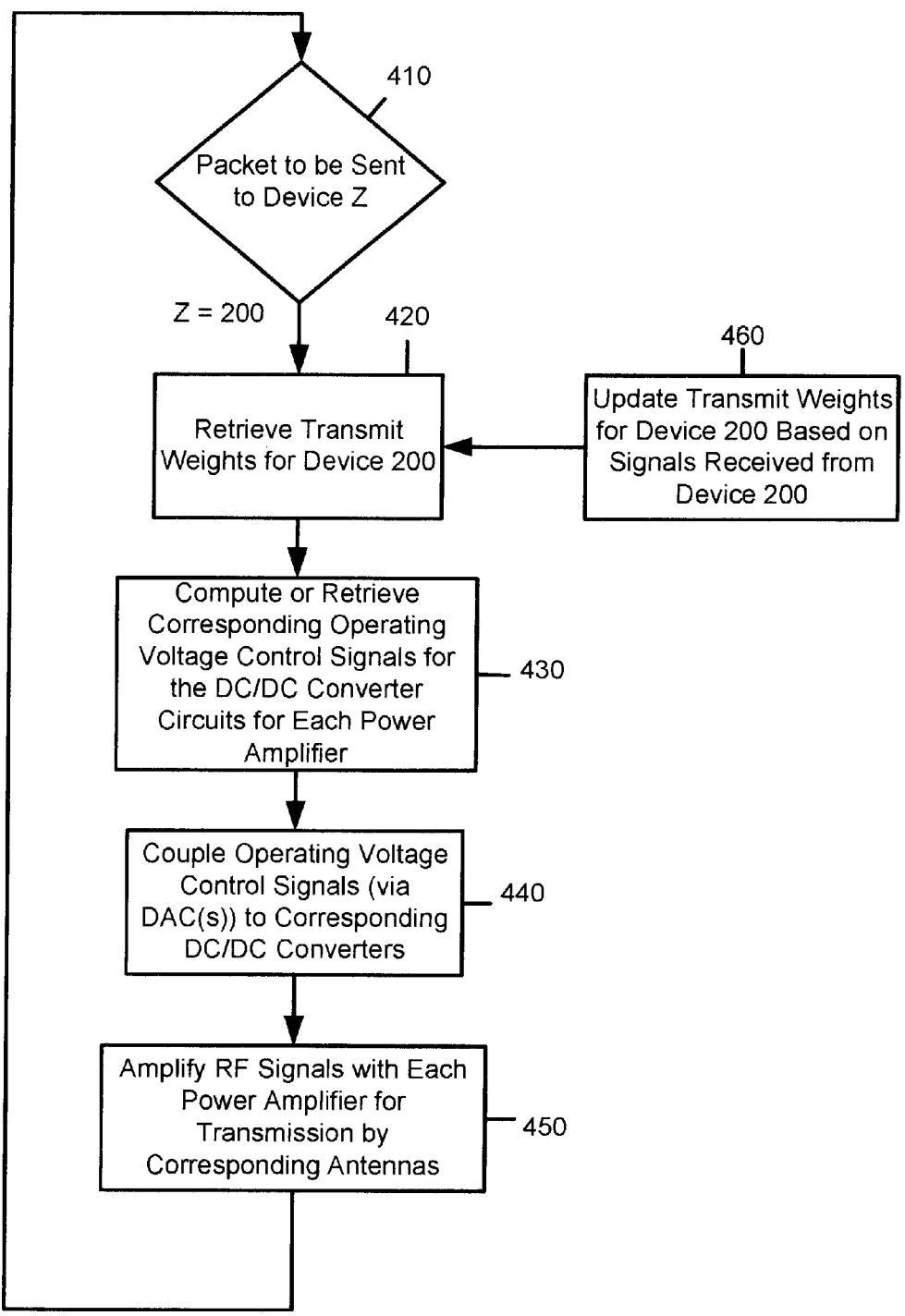
FIG. 6 is a flow chart depicting a method for controlling the power amplifiers in the beamforming radio transmitter system of FIG. 5.

The processes shown in FIGS. 4 and 6 for computing the control signals for the power amplifier may be implemented by instructions stored or encoded on a processor readable medium (e.g., memory associated with the microprocessor shown in FIGS. 1 and 5). The microprocessor would execute those instructions to generate the power amplifier control signals.

In summary, a method and a radio frequency transmission system is provided for optimizing the efficiency of each of a plurality of power amplifiers that amplify corresponding ones of a plurality of radio frequency signals for transmission by corresponding ones of a plurality of antennas. Each of the power amplifiers is controlled to operate with one or more operating parameters that optimize the efficiency for corresponding output power levels of corresponding radio frequency signals. The operating parameters that are optimized may be the bias voltage or current supplied to the power amplifiers, the operating voltage of the power amplifiers, or a combination thereof. In addition, the power amplifiers may be automatically biased by supplying signals to self-bias boosting circuits, each associated with a corresponding power amplifier, whereby the self-bias boosting circuit sets the bias of the corresponding amplifier depending on the level of input signal supplied to the power amplifier for amplification.

Further, a radio frequency signal transmission system is provided comprising a plurality of power amplifiers that amplify corresponding ones of a plurality of radio frequency signals for transmission by corresponding ones of a plurality of antennas. Each power amplifier is responsive to a corresponding control signal that adjusts at least one operational parameter to optimize the power amplifier efficiency for a corresponding output power level of the corresponding radio frequency signal. The at least one operational amplifier may be a bias current or voltage or an operating voltage, or a combination of both. Alternatively, a plurality of self-bias boosting circuits may be provided, each associated with corresponding ones of the plurality of power amplifiers, wherein each self-bias boosting circuit biases the corresponding power amplifier according to the power level of the corresponding radio frequency signal supplied as input to it.

Moreover, a processor readable medium is provided, wherein the medium is encoded with instructions that, when executed by a processor, cause the processor to generate power amplifier control signals based on corresponding ones of a plurality of transmit weights associated with the plurality of radio frequency signals to be simultaneously transmitted by corresponding antennas, wherein the power amplifier control signals adjust at least one operational parameter that optimizes the efficiency of a corresponding power amplifier for a corresponding output power level of the corresponding radio frequency signal.

The above description is intended by way of example only.

What is claimed is:

1. A method for optimizing the efficiency of each of a plurality of power amplifiers that amplify corresponding ones of a plurality of radio frequency signals for transmission by corresponding ones of a plurality of antennas, the method comprising the step of controlling one or more operating parameters of each of the power amplifiers based on values of a plurality of transmit weights applied to corresponding ones of a plurality of baseband transmit signals that, when upconverted, produce the plurality of radio frequency signals, thereby optimizing the efficiency of each power amplifier for output power levels of the corresponding radio frequency signals.

2. The method of claim 1, wherein the step of controlling is performed each time a transmission is to be made to optimize the efficiency of each of the power amplifiers for each transmission in the event the transmit weights have been updated since a previous transmission.

3. The method of claim 2, and further comprising the step of referring to a look-up-table that indexes transmit weights to values for the one or more operating parameters.

4. The method of claim 2, and further comprising the step of computing values for the one or more operating parameters based on the transmit weights.

5. The method of claim 1, wherein the step of controlling comprises generating a voltage or current bias for each power amplifier that optimizes the efficiency for the corresponding output power level.

6. The method of claim 5, wherein the step of controlling further comprises adjusting a level of an operating voltage for each of the power amplifiers that optimizes the efficiency for the corresponding output power levels.

7. The method of claim 1, wherein the step of controlling further comprises adjusting a level of an operating voltage for each of the power amplifiers that optimizes the efficiency for the corresponding output power levels.

8. A method for amplifying a plurality of radio frequency signals produced from a corresponding plurality of baseband transmit signals that are, weighted by a corresponding transmit weight, comprising supplying the plurality of radio frequency signals to corresponding ones of a plurality of self-bias boosting circuits associated with corresponding ones of the plurality of power amplifiers, wherein each self-bias boosting circuit biases the corresponding power amplifier according to the level of the corresponding radio frequency signal, determined by the corresponding transmit weight, supplied to it for amplification for simultaneous transmission.

9. A radio frequency signal transmission system comprising:
  a. a plurality of power amplifiers that amplify corresponding ones of a plurality of radio frequency signals for transmission by corresponding ones of a plurality of antennas;
  b. a plurality of power amplifier bias circuits, each associated with and connected to a corresponding one of the plurality of power amplifiers to bias the corresponding power amplifier according to an output power level for the radio frequency signal, wherein the plurality of radio frequency signals are to be simultaneously transmitted by corresponding ones of a plurality of antennas coupled to corresponding ones of the plurality of power amplifiers, to a destination device;
  c. a processor that generates control signals based on corresponding ones of a plurality of transmit weights associated with a plurality of baseband transmit signals from which the plurality of radio frequency signals are produced, wherein the controls signals are supplied to respective ones of the plurality of power amplifier bias circuits, to adjust at least one operational parameter to optimize the efficiency of each power amplifier for an output power level of the corresponding radio frequency signal.

10. The radio frequency signal transmission system of claim 9, and further comprising a plurality of DC/DC converters, each associated with and connected to a corresponding one of the plurality of power amplifiers and responsive to a corresponding one of the control signals produced by the processor to supply an operating voltage to each power amplifier according to a corresponding output power level for the radio frequency signal amplified by the corresponding power amplifier.

11. The radio frequency signal transmission system of claim 9, and further comprising a memory that stores the transmit weights.

12. The radio frequency signal transmission system of claim 11, wherein the memory stores transmit weights for each of a plurality of destination devices.

13. The radio frequency signal transmission system of claim 12, wherein the memory stores the transmit weights for the plurality of destination devices indexed against an identifier for each destination device.

14. The radio frequency signal transmission system of claim 12, wherein the memory stores values for the control signals indexed against transmit weights, and wherein the processor retrieves values for the control signals from the memory.

15. The radio frequency signal transmission system of claim 9, wherein the processor generates the control signals by retrieving values from a look-up-table that indexes transmit weights to values of the control signals.

16. The radio frequency signal transmission system of claim 9, wherein the processor generates the control signals by computing values for the one or more operational parameters based on the transmit weights.

17. The radio frequency signal transmission system of claim 9, wherein the processor controls the one or more operational parameters each time a transmission is to be made to optimize the efficiency of each of the power amplifiers for each transmission in the event the transmit weights have been updated since a previous transmission.

18. A processor readable medium encoded with instructions that, when executed by a processor, cause the processor to generate power amplifier control signals based on corresponding ones of a plurality of transmit weights associated with a plurality of baseband transmit signals from which a plurality of radio frequency signals are produced, the plurality of radio frequency signals are to be simultaneously transmitted by corresponding antennas, wherein the power amplifier control signals adjust at least one operational parameter that optimizes the efficiency of a corresponding power amplifier for an output power level of the corresponding radio frequency signal.

19. The processor readable medium of claim 18, wherein the instructions encoded on the medium comprise instructions for generating a voltage or current bias for a bias circuit associated with a corresponding power amplifier based on a corresponding one of a plurality of transmit weights associated with the radio frequency signals to be simultaneously transmitted by the corresponding antennas.

20. The processor readable medium of claim 18, wherein the instructions encoded on the medium comprise instructions for generating an operating voltage for each of the power amplifiers that optimizes the efficiency for corresponding output power levels based on a corresponding one of a plurality of transmit weights associated with the radio frequency signals to be simultaneously transmitted by the corresponding antennas.

21. The processor readable medium of claim 18, and further comprising instructions encoded on the medium to control the one or more operational parameters each time a transmission is to be made to optimize the efficiency of each of the power amplifiers for each transmission in the event the transmit weights have been updated since a previous transmission.

22. A radio frequency signal transmission system comprising:
   a. a plurality of power amplifiers that amplify corresponding ones of a plurality of radio frequency signals for transmission simultaneously by corresponding ones of a plurality of antennas coupled thereto; and
   b. a plurality of self-bias boosting circuits associated with corresponding ones of the plurality of power amplifiers, wherein each self-bias boosting circuit is connected to receive as input a corresponding radio frequency signal and biases the corresponding power amplifier according to a level of the corresponding radio frequency signal supplied for amplification, wherein the plurality of radio frequency signals are produced from a corresponding plurality of baseband transmit signals that have been weighted by a plurality of transmit weights.

* * * * *

UNITED STATES PATENT AND TRADEMARK OFFICE
CERTIFICATE OF CORRECTION

PATENT NO. : 6,871,049 B2
DATED : March 22, 2005
INVENTOR(S) : Sugar et al.

It is certified that error appears in the above-identified patent and that said Letters Patent is hereby corrected as shown below:

<u>Column 5,</u>
Line 3, delete "$P_n = \int |w_n(f)|^2 df$" and insert therefor -- $P_n = \int |w_n(f)|^2 df$ --.

Signed and Sealed this

Ninth Day of August, 2005

JON W. DUDAS
*Director of the United States Patent and Trademark Office*